United States Patent [19]

Weiss et al.

[11] Patent Number: 5,012,178

[45] Date of Patent: Apr. 30, 1991

[54] LOW NOISE DAC CURRENT SOURCE TOPOLOGY

[75] Inventors: Frederick G. Weiss, Newberg; Daniel G. Knierim, Beaverton, both of Oreg.

[73] Assignee: TriQuint Semiconductor, Inc., Beaverton, Oreg.

[21] Appl. No.: 495,177

[22] Filed: Mar. 19, 1990

[51] Int. Cl.$^5$ .............................................. G05F 3/30
[52] U.S. Cl. ................................... 323/269; 323/312; 323/315; 341/153
[58] Field of Search ............... 323/269, 311, 312, 315; 341/153, 154

[56] References Cited

U.S. PATENT DOCUMENTS

| | | | |
|---|---|---|---|
| 3,675,114 | 7/1972 | Nercessian | 323/269 |
| 4,280,091 | 7/1981 | Hiltner | 323/315 |
| 4,573,005 | 2/1986 | van de Plassche | 323/315 |
| 4,712,091 | 12/1987 | Schoofs et al. | 323/312 |
| 4,864,216 | 9/1989 | Kalata et al. | 323/315 |

FOREIGN PATENT DOCUMENTS 173524 8/1986 Japan .

Primary Examiner—William H. Beha, Jr.
Attorney, Agent, or Firm—Alan K. Aldous

[57] ABSTRACT

An electrical circuit (30) corrects for the presence of noise current and current drift in the currents developed by each current source transistor $Q_0, Q_1, Q_2, Q_3, \ldots Q_n$ in a current source array. The electrical circuit corrects for the presence of noise current and current drift by simultaneously inducing in each current source correction currents whose values sum to cancel the current drift and noise. A noise suppression circuit includes an amplifier having an open loop gain, $A_v$, which is configured to adjust the magnitudes of the multiple currents in response to the introduction of a noise current, $i_\delta$, in any one of the currents. The adjustment substantially cancels $i_\delta$ and thereby substantially reduces the presence of $i_\delta$ in the output current. The presence of $i_\delta$ in the output signal is substantially equal to $i_\delta/(1+A_v)$.

7 Claims, 2 Drawing Sheets

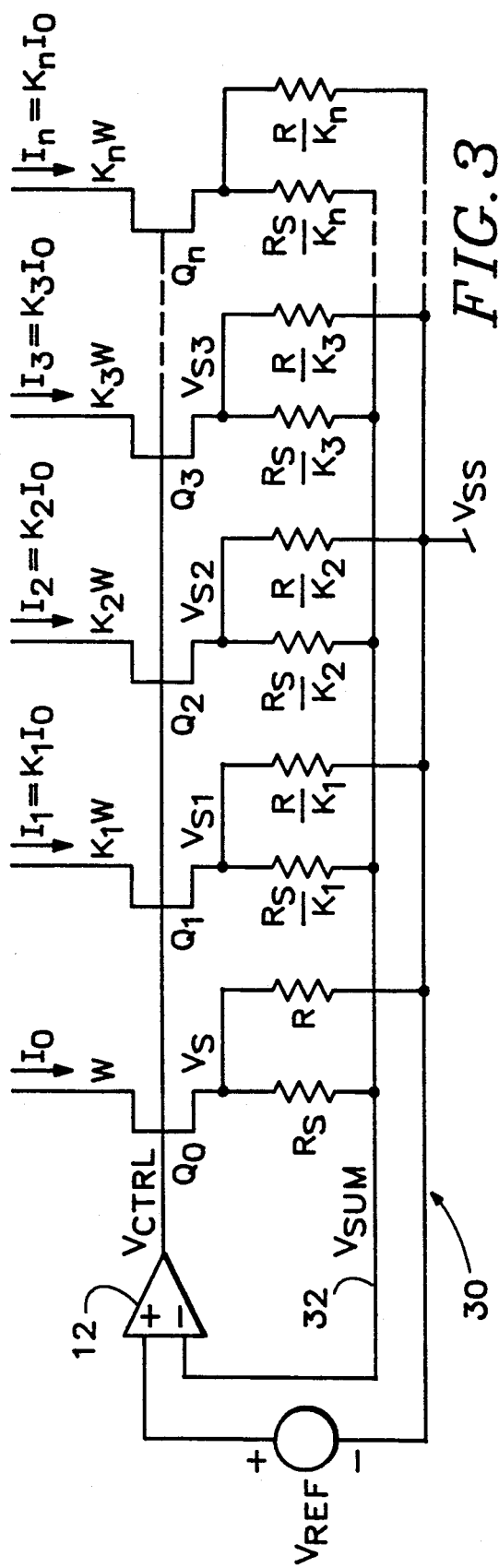
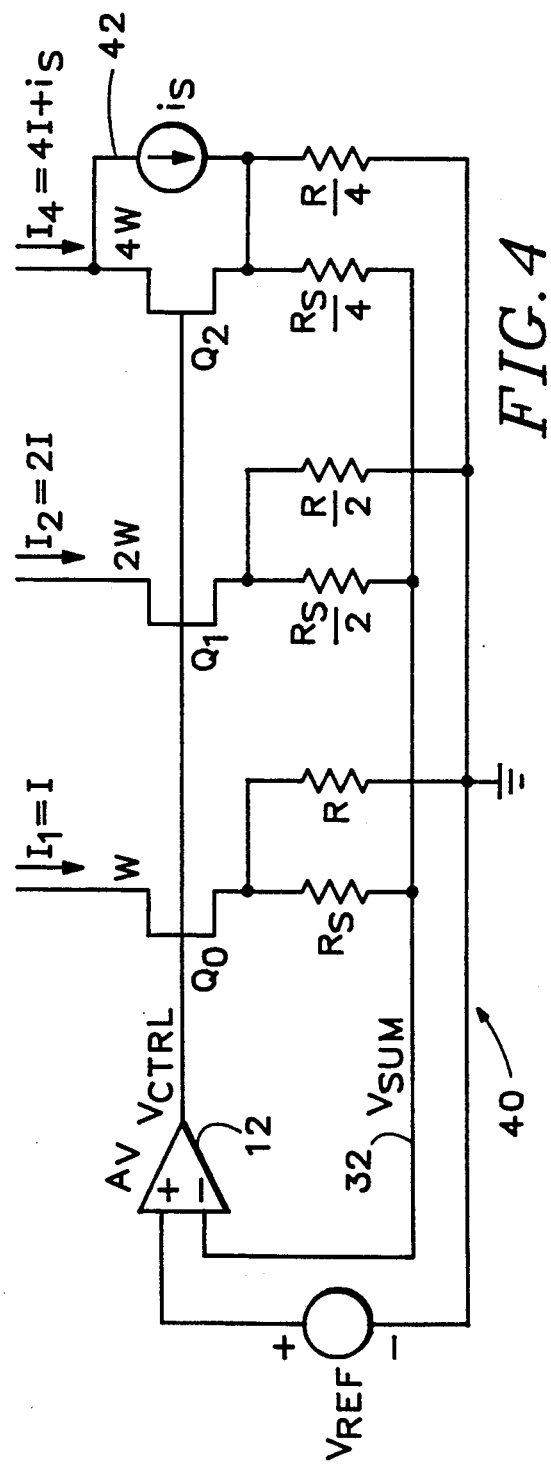

LOW NOISE DAC CURRENT SOURCE TOPOLOGY

FIELD OF THE INVENTION

The present invention relates to noise suppression circuitry for a current source array and, in particular, to a noise suppression controller circuit that is implemented in such an array to reduce the overall amount of noise present in the source output current, irrespective of the current source array element in which the noise appeared.

BACKGROUND OF THE INVENTION

FIGS. 1 and 2 show respective prior art circuits 10 and 20 that implement conventional techniques for suppressing noise in current source arrays. Circuits 10 and 20 are typically used in a digital-to-analog converter (DAC). Circuits 10 and 20 include multiple current sources that include junction field effect transistors $Q_0$, $Q_1$, $Q_2$, $Q_3$, ..., $Q_n$, respectively, where the number of current sources is n+1. The sizes of the gate widths of transistors $Q_0$, $Q_1$, $Q_2$, $Q_3$, ..., $Q_n$, are w, $k_1$w, $k_2$w, $k_3$w, ... $k_n$w, respectively. The gates of transistors $Q_0$, $Q_1$, $Q_2$, $Q_3$, ..., $Q_n$ are connected to the output $V_{ctrl}$ of an operational amplifier 12.

The sources of transistors $Q_0$, $Q_1$, $Q_2$, $Q_3$, ..., $Q_n$ are connected to respective source degeneration resistors R, $R/k_1$, $R/k_2$, $R/k_3$, ..., $R/k_n$, which are connected to a bias voltage source, $V_{ss}$. The currents flowing into the drains of transistors $Q_0$, $Q_1$, $Q_2$, $Q_3$, ..., $Q_n$ are $I_o$, $k_1 I_o$, $k_2 I_o$, $k_3 I_o$, ..., $k_n I_o$, respectively. In a DAC, the typical values of the weighting factors are $k_1=2$, $k_2=4$, $k_3=8$, ... $k_n=2^n$.

Circuits 10 and 20 differ from each other in that circuit 10 detects the value of the current by sensing the voltage across the source resistor R and circuit 20 detects the value of the current by sensing voltage across a load resistor $R_L$. In circuit 10, the negative input to operational amplifier 12 is connected to the source of $Q_0$. In circuit 20, the positive input of operational amplifier 12 is connected to the drain of $Q_0$.

The values of the currents $I_o$, $k_1 I_o$, $k_2 I_o$, $k_3 I_o$, ..., $k_n I_o$ for transistors $Q_0$, $Q_1$, $Q_2$, $Q_3$, ..., $Q_n$ in circuits 10 and 20 are set by three factors: (1) the voltage difference between $V_{ctrl}$ and $V_{ss}$, (2) the gate widths, and (3) the inverse ratios of source degeneration resistors.

The value of $V_{ctrl}$ is controlled by a negative feedback loop, which is associated with operational amplifier 12, that senses a feedback voltage that is directly proportional to a reference current $I_o$, and compares that voltage with a reference voltage $V_{ref}$. In circuit 10, the feedback voltage is generated from the voltage drop across source degeneration resistor R that is connected to transistor $Q_0$. In circuit 20, the feedback voltage is generated from the output current of transistors $Q_0$ flowing through load resistor $R_L$.

In both circuit 10 and circuit 20, however, the current produced by only one of the current sources is sensed and, ultimately, controlled. All of the remaining current sources are slaved to the controlled current source but are outside of the control loop. Under ideal conditions this would not be a problem.

Under real conditions, however, noise currents and/or current drift will cause instantaneous and random deviations in the relative magnitudes of the currents $k_1 I_o$, $k_2 I_o$, $k_3 I_o$, ..., $k_n I_o$ which are outside of the feedback loop, and which thus can neither be sensed nor corrected for. In addition, the noise in the loop control path ($Q_0$, R) which is compensated by the loop is amplified by the current sources outside of the loop. Therefore, as $V_{ctrl}$ varies to compensate for the noise in the reference source, the currents of all of the other sources are modulated in like fashion, which can lead to a net increase in noise.

There is a need, therefore, for a controller of a group of current sources that reduces the overall output noise of the group of current sources.

SUMMARY OF THE INVENTION

An object of the invention, therefore, is to provide a controller circuit for a current source array to reduce the overall amount of noise present in the source output current.

Another object of the invention is to correct for drift and noise simultaneously in all current source elements included in the array.

An electrical circuit according to the present invention corrects for the presence of noise current and current drift in the currents developed by each current source in a current source array. The electric circuit corrects for the presence of noise current or current drift by simultaneously inducing in each current source a correction current whose values sum to cancel the current drift and noise. A noise suppression circuit includes an amplifier having an open loop gain, $A_v$, and is configured to adjust the magnitudes of the multiple currents in response to the introduction of a noise current, $i_\delta$, in a particular one of the currents. The adjustment substantially offsets $i_\delta$ and thereby substantially reduces the presence of $i_\delta$ in the output current. The presence of $i_\delta$ in the output signal is substantially equal to $i_\delta/(1+A_v)$.

BRIEF DESCRIPTION OF THE DRAWINGS

FIG. 3 shows a current source topology of the present invention that corrects for drift and noise currents simultaneously in all current sources in a current source array.

FIG. 4 shows a topology of the present invention that controls three binary-weighted current sources.

DETAILED DESCRIPTION OF THE DRAWINGS

Figure 1:
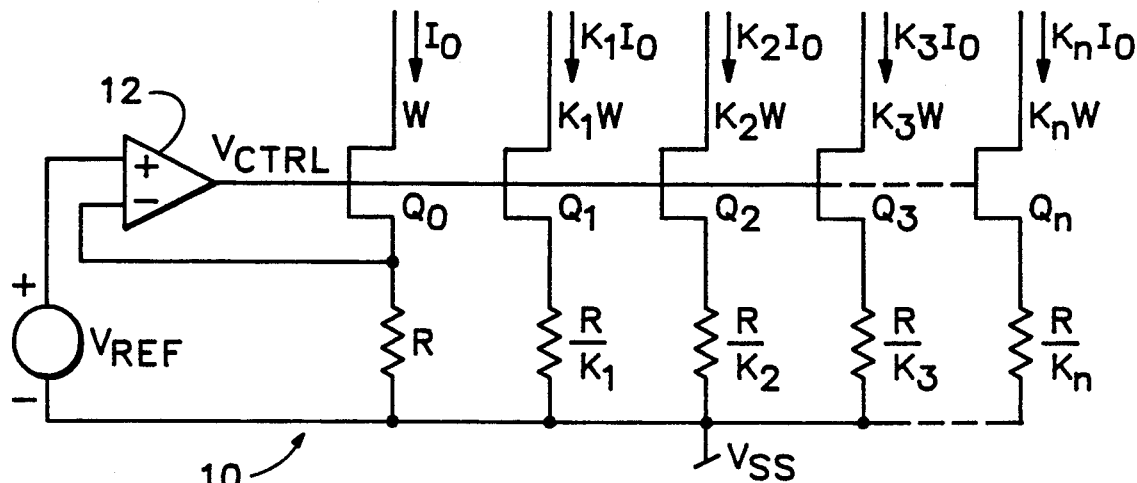
FIG. 1 shows a prior art current source control topology using source resistor current sensing.
Figure 2:
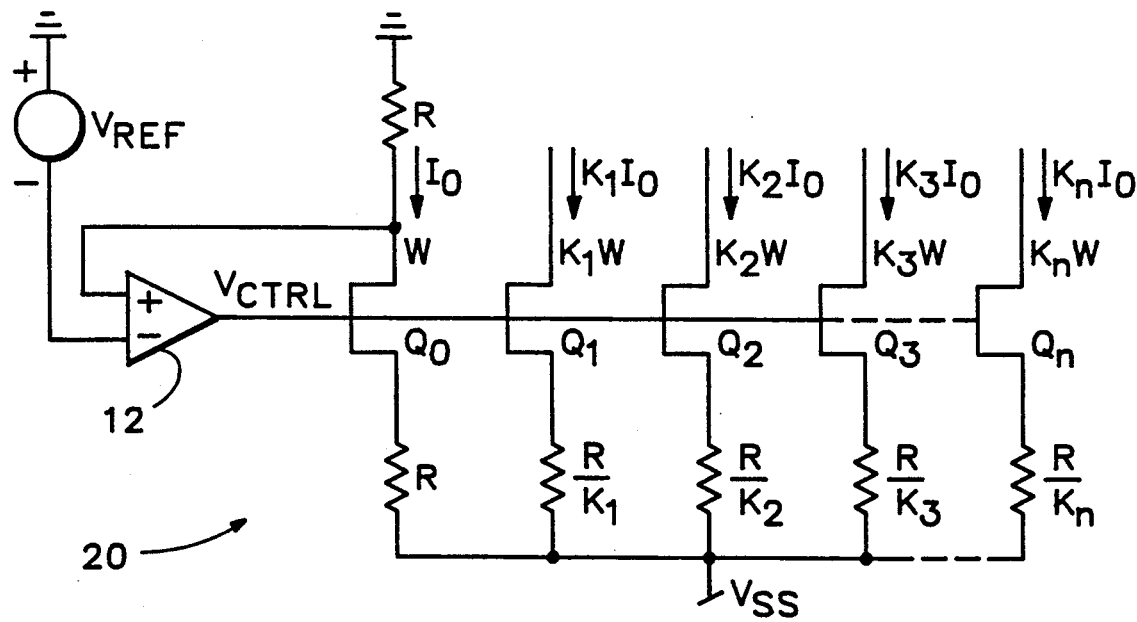
FIG. 2 shows a prior art current source control topology using output current sensing.

A preferred embodiment of the present invention is shown in circuit 30 of FIG. 3, which employs the array of current sources including transistors $Q_0$, $Q_1$, $Q_2$, $Q_3$, ..., $Q_n$, source resistors R, $R/k_1$, $R/k_2$, $R/k_3$, ..., $R/k_n$, and operational amplifier 12 of circuits 10 and 20.

Circuit 30 solves the problem of incorrectly compensating transistors $Q_0$, $Q_1$, $Q_2$, $Q_3$, ..., $Q_n$ by adding sense resistors $R_s$, $R_s/k_1$, $R_s/k_2$, $R_s/k_3$, ..., $R_s/k_n$ between the sources of transistors $Q_0$, $Q_1$, $Q_2$, $Q_3$, ..., $Q_n$ and the negative input of operational amplifier 12. Circuit 30 thereby corrects for drift and noise in all current sources simultaneously. The values of sense resistors $R_s$, $R_s/k_1$, $R_s/k_2$, $R_s/k_3$, ..., $R_s/k_n$ are preferably much larger than the value of the corresponding source resistors R, $R/k_1$, $R/k_2$, $R/k_3$, ..., $R/k_n$ so that the sense resistors do not affect the proportion of resistance values established by the source resistors.

The currents flowing into the drains of transistors $Q_0$, $Q_1$, $Q_2$, $Q_3$, ..., $Q_n$ are $I_o$, $I_1 = k_1 I_o$, $I_2 = k_2 I_o$, $I_3 = k_3 I_o$, ..., $I_n = k_n I_o$, respectively. Circuit 30 is preferably used in a DAC. The value of the output current of the DAC is equal to constant current $I_o$ multiplied by the decimal value of a binary input word.

The voltage at node 32 to which the sense resistors $R_s$, $R_s/k_1$, $R_s/k_2$, $R_s/k_3$, ..., $R_s/k_n$ are connected is $V_{sum}$. The voltages across the sense resistors are summed at node 32. Sense resistors $R_s$, $R_s/k_1$, $R_s/k_2$, $R_s/k_3$, ..., $R_s/k_n$ are connected to source resistors R, $R/k_1$, $R/k_2$, $R/k_3$, ..., $R/k_n$, respectively, at the sources of transistors $Q_0$, $Q_1$, $Q_2$, $Q_3$, ..., $Q_n$, which have voltages $V_s$, $V_{s1}$, $V_{s2}$, $V_{s3}$, ..., $V_{sn}$ at their respective sources.

The voltages across all of the source resistors R, $R/k_1$, $R/k_2$, $R/k_3$, ..., $R/k_n$, are sensed at all times, summed together, and compared to a reference voltage, $V_{ref}$, which is the voltage between $V_{ss}$ and the positive input of operational amplifier 12. If no drift or noise is present, then all of the source resistors have identical voltage drops and no current flows through sense resistors $R_s/k_i$. Therefore, $V_{sum} = V_s = V_{s1} = V_{s2} = V_{ss} = \ldots V_n$, and all currents are related by the established ratios $k_1, k_2, k_3 \ldots, k_n$.

In the following discussion, a particular one of the transistors $Q_0$, $Q_1$, $Q_2$, $Q_3$, ..., $Q_n$ is referred to as $Q_i$. The particular source resistor and sense resistor attached to the source of $Q_i$ are referred to as $R/k_i$ and $R_s/k_i$, respectively, where $k_i = 1$ for $Q_0$.

If drift or noise causes the current in $Q_i$ to change by an incremental amount $i_\delta$, then there will be a resulting incremental voltage drop $v_\delta$ across the source resistor $R/k_i$. The incremental voltage drop $v_\delta$ is proportional to the incremental current change $i_\delta$, according to the following relationship: $v_\delta = i_\delta (R/k_i)$.

The combination of $R_s/k_j$ and $R_s/k_i$ (where j does not equal i) divides the voltage $V_s$ occurring at the source of $Q_1$. The voltage divider effect leads to a change in $V_{sum}$ by a weighted fraction of $v_\delta$, where the weighting factor is the ratio of the current through $Q_i$ to the sum of the currents through all of the other transistors $Q_0$, $Q_1$, $Q_2$, $Q_3$, ... $Q_n$, not including $Q_i$. The feedback loop then changes $V_{ctrl}$ in the direction to compensate for $i_\delta$. The changes in all of the current sources add up to virtually cancel the original noise pulse $i_\delta$.

The result of the change in $v_{ctrl}$ is that the net output noise from all of the current sources resulting from any noise current $i_\delta$ is not $i_\delta$, but rather $i_\delta$ divided by one plus the open loop gain, $A_v$. Furthermore, since the correction current induced in each current $I_1, I_2, \ldots, I_n$ is proportional to its weight $k_1, k_2, \ldots, k_n$, respectively, the instantaneous scaling error between current sources is minimized. The scaling error would translate into an instantaneous differential non-linearity if the current source array were used in a DAC.

Referring to FIG. 4, an example of the invention is illustrated in connection with circuit 40. Circuit 40 includes three binary-weighted current source transistors $Q_0$, $Q_1$, and $Q_2$, having gate widths w, 2w, and 4w. $I_1$ and $I_2$ represent the currents that flow into the drains of $Q_0$ and $Q_1$, respectively. $I_4$ represents the current that flows into the node that connects the drain of $Q_2$ with current source 42. The drain current values are $I_1 = I$, $I_2 = 2I$, and $I_4 = 4I_\delta$, where I is a suitable current value, and $i_\delta$ is the current introduced from noise or drift, modeled as current source 42.

Source resistors R, R/2, and R/4 are connected between the sources of transistors $Q_0$, $Q_1$, and $Q_2$, respectively, and ground. Sense resistors $R_s$, $R_s/2$, and $R_s/4$ are connected in between the sources of transistors $Q_0$, $Q_1$, and $Q_2$, respectively, and $V_{sum}$ at the negative input of operational amplifier 12.

For purposes of clarity, the following simplifying assumptions are made: First, the gate to source voltage for transistors $Q_0$, $Q_1$, and $Q_2$ is assumed to be $V_{GS} = 0V$. Second, $V_{GS}$ is assumed to be constant at all times, and any variation in $V_{ctrl}$, the output of operational amplifier 12, appears as a change in the voltage drop across source resistors R, R/2, and R/4; i.e., $g_m R \gg 1$. Third, the value of sense resistor $R_s$ is much larger than the values of source resistor R and $1/g_m$. Fourth, operational amplifier 12 is ideal, i.e., the input offset and bias current are zero, and the gain is infinite. Note that the above approximations are used to simplify the mathematical expressions but do not affect the general nature of the invention.

The basic principles underlying the operation of circuit 40 are readily illustrated by the following equations. The analysis will first be made for the situation in which there is zero noise and drift, i.e., $i_\delta = 0$. Writing the loop equations around circuit 40 yields equation (1) and equation (2), by superposition, below:

$$V_{ctrl} = A_v (V_{ref} - V_{sum}) \tag{1}$$

where $V_{ctrl}$, $A_v$, $V_{ref}$, and $V_{sum}$ are described above.

$$V_{sum} = \frac{(I_1 R)(R_S/2 \| R_S/4)}{(R_S) + (R_S/2 \| R_S/4)} + \frac{(I_2 R/2)(R_S \| R_S/4)}{(R_S/2) + (R_S \| R_S/4)} + \frac{(I_4 R/4)(R \| R_S/2)}{(R_S/4) + (R \| R_S/2)} \tag{2}$$

where $V_{sum}$, R, and $R_s$ are described above, and as noted above $I_1 = I$, $I_2 = 2I$, and $I_4 = 4I + i_\delta$, where I is a suitable current value. The symbol $\|$ represents parallel resistors. For example, $x \| y$ means that resistors x and y are in parallel.

Equation (2) can be rewritten as equation (2'), below:

$$\begin{aligned} V_{sum} &= IR/7 + 2(2I)(R/2)/7 + 4(4I)(R/4)/7 \\ &= IR(1 + 2 + 4)/7 = IR \end{aligned} \tag{2'}$$

where R and I are described above. But, $IR = V_{ctrl}$, so by substitution, equation (2') yields equation (3), below:

$$V_{sum} = V_{ctrl} \tag{3}$$

Substituting equation (3) into equation (1) yields equations (4) and (5), below:

$$V_{ctrl} = A_v(V_{ref} - V_{ctrl}) \tag{4}$$

$$V_{ctrl} = V_{ref}\left(\frac{A_v}{1 + A_v}\right), \tag{5}$$

In equation (5), $V_{ctrl}$ is virtually identical to $V_{ref}$ for $A_v \gg 1$. Equations (6a), (6b), (6c), and (7), below, follow from equations (2'), (3), and (5).

$$I_1 = V_{ref}/R \tag{6a}$$

$$I_2 = 2V_{ref}/R \tag{6b}$$

$$I_4 = 4V_{ref}/R \tag{6c}$$

$$I_{total} = \Sigma I_{bit} = I_1 + I_2 + I_4 = 7\,(V_{ref}/R) \tag{7}$$

where $I_{total}$ is the total current that represents a digital word, $I_{bit}$ is a bit of the input digital word, and $I_1$, $I_2$, $I_4$, $V_{ref}$, and R are as described above.

If noise source $i_\delta$, which is in parallel with current source transistor $Q_{44}$ is now made to be non-zero, then the loop equations are expressed in equations (1) (restated for reference) and (8).

$$V_{ctrl} = A_v(V_{ref} - V_{sum}) \tag{1}$$

$$\begin{aligned}V_{sum} &= IR/7 + 2IR/7 + [4IR + 4i_\delta R/4]/7 \\ &= IR/7 + 2IR/7 + 4IR/7 + i_\delta R/7\end{aligned} \tag{8}$$

Substituting $IR = V_{ctrl}$ yields equation (9), below:

$$\begin{aligned}V_{sum} &= V_{ctrl}/7 + 2V_{ctrl}/7 + 4V_{ctrl}/7 + Ri_\delta/7 \\ &= V_{ctrl} + Ri_\delta/7\end{aligned} \tag{9}$$

Thus, equation (1) can be rewritten as equation (10), below:

$$\begin{aligned}V_{ctrl} &= A_v(V_{ref} - V_{sum}) = A_v(V_{ref} - V_{ctrl} - (Ri_\delta/7)) \\ &= A_v(V_{ref} - V_{ctrl}) - A_v Ri_\delta/7 \\ &= \left(\frac{A_v}{1+A_v}\right)(V_{ref} - Ri_\delta/7)\end{aligned} \tag{10}$$

which is the original value of $V_{ctrl}$ plus an error term. The total output current is expressed as equation (11), below:

$$\begin{aligned}I_{total} &= V_{ctrl}/R + 2V_{ctrl}/R + 4V_{ctrl}/R + i_\delta \\ &= 7V_{ctrl}/R + i_\delta\end{aligned} \tag{11}$$

Substituting for $V_{ctrl}$ from equation (10) yields equation (12), below:

$$\begin{aligned}I_{total} &= (7/R)\left[\left(\frac{A_v}{1+A_v}\right)(V_{ref} - (Ri_\delta/7))\right] + i_\delta \\ &= \left[7(V_{ref}/R)\left(\frac{A_v}{1+A_v}\right)\right] + \frac{i_\delta}{(1+A_v)}\end{aligned} \tag{12}$$

Equation (12) represents the original value for $I_{total}$ (in []) plus an error term, $i_\delta/(1+A_v)$, which is much less than the original value of $i_\delta$ before compensation. This is the desired result.

It would be obvious to those skilled in the art that many changes may be made in the above described details of the preferred embodiment of the present invention without departing from the underlying principles thereof. In particular, bipolar junction transistors, MOSFETS, MESFETS or other types of transistors may be used in place of the JFETS used in the examples. The scope of the present invention should, therefore, be determined only by the following claims.

We claim:

1. An electrical circuit that provides an output current, comprising:
   multiple current source means for producing respective multiple currents;
   current sensing means for sensing each of the multiple currents and sensing an increase $i_\delta$ in the magnitude of one of the multiple currents, the current sensing means producing an indication signal that is indicative of $i_\delta$; and
   compensation means responsive to the indication signal for providing to each one of the current source means a compensation signal in response to which the multiple current source means adjusts the multiple currents to substantially offset $i_\delta$ and thereby substantially reduce a presence of $i_\delta$ in the output current.

2. The circuit of claim 1, wherein the compensation means includes an amplifier that has a gain $A_v$, and the presence of $i_\delta$ in the output signal is substantially equal to $i_\delta/(1+A_v)$.

3. The circuit of claim 1, wherein the sensing means includes a resistor having value R, and the indication signal immediately after occurrence of $i_\delta$ is substantially equal to the indication signal immediately proceeding the occurrence of $i_\delta$ plus a weighted fraction of $v_\delta$, where $v_\delta = i_\delta R$ and the weighting factor is the ratio of the particular one of the multiple currents to the sum of all of the currents.

4. The circuit of claim 1, wherein the compensation signal is simultaneously provided to each one of the current source means.

5. The circuit of claim 1, wherein the current source means includes multiple field effect transistors and the compensation signal is applied to the gate of each transistor.

6. The circuit of claim 1, wherein the current source means includes multiple transistors, and the current sensing means includes multiple resistors, each of the resistors being connected to one of the transistors and to the compensation means.

7. The circuit of claim 1, wherein the compensation means includes an operational amplifier.

* * * * *